United States Patent [19]
Kawamura

[11] Patent Number: 5,485,424
[45] Date of Patent: Jan. 16, 1996

[54] SEMICONDUCTOR MEMORY AND REDUNDANT-ADDRESS WRITING METHOD

[75] Inventor: Shouichi Kawamura, Kawasaki, Japan

[73] Assignee: Fujitsu Limited, Kawasaki, Japan

[21] Appl. No.: 172,250

[22] Filed: Dec. 23, 1993

[30] Foreign Application Priority Data

Mar. 18, 1993 [JP] Japan ................................. 5-058967

[51] Int. Cl.$^6$ ............................ G11C 29/00; H01L 27/10
[52] U.S. Cl. ................. 365/200; 365/225.7; 365/230.06; 365/230.03
[58] Field of Search ..................................... 365/200, 201, 365/225.7, 185, 230.03, 230.06; 371/10.1, 10.2, 10.3

[56] References Cited

U.S. PATENT DOCUMENTS

| 5,179,536 | 1/1993 | Kasa et al. .......................... 371/10.2 X |
| 5,233,566 | 8/1993 | Imamiya et al. ..................... 365/200 X |
| 5,241,510 | 8/1993 | Kobayashi et al. ................ 365/230.03 |
| 5,325,333 | 6/1994 | Sato .................................... 371/10.1 X |

Primary Examiner—David C. Nelms
Assistant Examiner—Huan Hoang
Attorney, Agent, or Firm—Nikaido, Marmelstein, Murray & Oram

[57] ABSTRACT

The objects of the present invention are to enhance the operating speed by improving the access speed to a redundant memory, and also to enable a redundant address to be written into an electrically programmable memory device, which stores the redundant address, even for a semiconductor memory designed to operate with a low-voltage, single power supply. In a semiconductor memory according to a first aspect of the invention, an address detection circuit, which determines whether the access is for a replaced element, is constructed with a gate circuit that can be set either to such a state as to enable one of two complementary input signals for output or to a high impedance state, and a signal line, onto which a signal to inhibit the selection of normal memory cells is output upon detection of an address signal for redundancy, is directly controlled by an output of a redundancy memory circuit which stores the state of the redundancy function. Furthermore, in a semiconductor memory according to a second aspect of the invention, the write voltage for writing an address into a redundancy nonvolatile semiconductor memory is supplied from outside the semiconductor memory.

8 Claims, 13 Drawing Sheets

SEMICONDUCTOR MEMORY AND REDUNDANT-ADDRESS WRITING METHOD

BACKGROUND OF THE INVENTION

1. Field of the Invention

The present invention relates to a semiconductor memory having a redundancy function whereby defective elements are replaced by redundant elements, thereby improving the production yield, and more particularly to a semiconductor memory that uses an electrically programmable nonvolatile semiconductor memory as a redundant-address storing memory for storing the address of a replaced element.

2. Description of the Prior Art

Semiconductor memories are not allowed to contain even a single defect in their memory cell arrays, and if a defect is present in any one of the memory cells, the semiconductor memory is rendered defective. However, as the capacity of semiconductor memory increases, it is becoming increasingly difficult to fabricate memory cell arrays that contain no defective bits. In particular, in the case of semiconductor memories developed using new manufacturing technologies, the problem is that the defect rate tends to be high and the yield tends to be extremely low in the initial period of mass production.

Redundant circuit techniques are used to overcome this problem.

Semiconductor memories using redundant circuit techniques contain redundant memory cells, in addition to the normal memory cell arrays consisting of normal cells, that are brought into use to replace defective normal cells, and a redundancy decision circuit that performs control so that, when access is attempted to a defective normal cell, the access is actually made to the redundant memory cell. The redundancy decision circuit is required to detect any attempted access to defective normal cells. For this purpose, the redundancy decision circuit of the prior art includes a fuse ROM for storing the addresses of replaced elements and a match detection circuit for detecting whether the input address signal matches the address of a replaced element. In the following, the address stored in the fuse ROM is called the redundant address. The match detection circuit is usually constructed with exclusive NOR gates, the number of which is equal to the number of address bits used to access the replaced element, and a multiple-input AND or NAND gate to which the outputs of the exclusive NOR gates are input. Furthermore, when no normal cells are defective and the redundancy mechanism is not switched on, it is not necessary to select a redundant cell even if the input address matches the redundant address. For this purpose, the redundancy decision circuit further includes a redundancy memory circuit for storing information regarding whether the redundancy function has been switched on. This redundancy memory circuit is usually constructed with a fuse ROM. When the redundancy function is switched on, if the address signal matches, selection of the normal cell is disabled by the output of the redundancy memory circuit; on the other hand, when the redundancy is not switched on, the normal cell is selected for access while disabling access to the redundant memory cell even if the address signal matches.

While the prior art redundancy decision circuit using the fuse ROMs, as described above, has the advantage that the area that the redundancy decision circuit takes up is small, the prior art configuration involves a cumbersome procedure in fabrication, requiring removal of the wafer from die sorting equipment that holds the wafer in place, blowing the fuses using a laser cutting device, and then retesting the completed circuit. This presents a problem in that polysilicon particles generated by the laser cutting device may adversely affect other circuit elements.

To avoid this problem, there is proposed a semiconductor memory which uses an EPROM, instead of the fuse ROM, for storing a redundant address. Writing to an EPROM requires the application of a higher-than-normal voltage to the EPROM gate, and the power supply circuit has a switching function for switching to the appropriate supply voltage. The semiconductor memory using an EPROM for storing a redundant address uses the same match detection circuit as described above, consisting of a plurality of exclusive NOR gates and an AND or NAND gate, to detect whether the input address signal matches the stored address.

In the fabrication of a semiconductor memory that uses EPROMs for the redundant-address detection circuit and redundancy memory circuit, a processing step is required for forming the EPROMs; at this time, this configuration is employed for memories whose normal memory cells are fabricated using EPROM, EEPROM, or flash memory technology. Using EPROMs for the redundant-address detection and redundancy memory circuits requires a write circuit for writing a redundant address to the EPROMs of the redundancy decision circuit, and therefore has the problem of increasing the size and complexity of the entire circuit. On the other hand, compared with the configuration using fuse ROMs, the configuration using EPROMs has the advantages that the redundancy can be built in and retesting can be carried out while, at the same time, conducting die sorting, and that the process does not generate polysilicon particles that could adversely affect other circuit elements.

The prior art semiconductor memories having redundant circuits described above have the problem that the circuit size is increased when the circuit comprising exclusive NOR gates is used for identifying a redundant address. A further problem is that the access speed to a redundant cell is slower compared to the access speed to a normal cell since the access needs to be processed not only through the redundant-address detection circuit but through further gates before being combining with the output of the redundancy memory circuit that stores information as to whether the redundant cell is to be used. The operating speed of a semiconductor memory is defined on the basis of the slowest access speed. In the above case, the access speed to the redundant cell determines the operating speed of the memory. The recent trend to higher microprocessor speeds requires increasing the operating speeds of semiconductor memories, and it is desirable that the memory have the highest possible speed.

Furthermore, with the recent trend to decreased operating voltages for electronic appliances, semiconductor memories are being designed to operate on lower voltages than before. Semiconductor memories, such as EPROMs, EEPROMs, and flash memories, require the application of a higher gate voltage when writing than when reading, but even in the case of these semiconductor memories that require two different voltages, the memories are being designed for use with a single power supply to reduce the load on electronic appliances.

For semiconductor memories designed for use with a single low-voltage power supply, using EPROMs, etc. for storing redundant addresses gives rise to a problem as to how the redundant addresses should be written.

In the case of EPROMs, EEPROMs, and flash memories that are designed for use with a single low-voltage, power supply, the write voltage needs to be boosted internally, but since the provision of a booster circuit takes up chip area, the booster circuit must be designed to have just enough capacity for writing to the normal cells if the chip area is to be reduced. Large-capacity semiconductor memories, however, require eight or more bits for each of the row and column addresses. The problem here is that the redundant-address bits cannot be written using a low capacity internal booster circuit.

SUMMARY OF THE INVENTION

A first object of the invention is to provide a semiconductor memory having a redundancy circuit which does not complicate the process of building in redundancy and which provides the access speed comparable to the access speed for reading a normal cell. A second object of the invention is to enable a redundant address to be written in even if the semiconductor memory is of the type designed for use with a single low-voltage power supply and yet uses electrically programmable memory devices such as EEPROM for the redundancy circuit.

In a semiconductor memory according to a first aspect of the invention, to accomplish the first object, an address detection circuit is constructed with a gate circuit that can be set either to such a state as to enable one of two complementary input signals for output or to a high impedance state, and a signal line, onto which a signal to inhibit the selection of normal memory cells is output upon detection of an address signal for redundancy, is directly controlled by an output of a redundancy memory circuit which stores the switched on state of the redundancy.

The semiconductor memory according to the first aspect of the invention does not rely on the use of exclusive NOR gates for evaluating a redundant address match, and therefore, serves to reduce the size of a redundancy circuit even if a redundant-address memory 6 is constructed from a nonvolatile memory so that the redundancy can be built in and retesting of the completed circuit conducted during die sorting. Furthermore, a reduction is achieved in the number of gates through which the address signal input to the redundancy decision circuit passes before accessing a redundant memory. This serves to improve the access speed.

In a semiconductor memory according to a second aspect of the invention, a redundant-address storing memory for storing an address for substituting a redundant cell is constructed from an electrically programmable nonvolatile semiconductor memory. The write voltage for writing the address into the redundancy nonvolatile semiconductor memory is supplied from outside the semiconductor memory; preferably, the write voltage is supplied via a special electrode pad which is not used in the final assembled state of the semiconductor memory.

In the semiconductor memory according to the second aspect of the invention, since the write voltage for writing the address into the redundancy nonvolatile semiconductor memory is supplied from outside the semiconductor memory, the redundant address can be written even if the semiconductor memory is designed for use with a single low-voltage power supply. Furthermore, if the write voltage is supplied via the special electrode pad which is not used when assembled into a product, problems such as the application of stress to peripheral circuitry can be avoided.

In a semiconductor memory according to a third aspect of the invention, when writing a redundant address into the redundancy nonvolatile semiconductor memory, the redundant address is divided into a plurality of bits which are then written in by time division.

In the semiconductor memory according to the third aspect of the invention, since the redundant address is divided into a plurality of bits for writing, the capacity of the high-voltage power supply used for redundant-address writing can be reduced.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Before proceeding to a detailed description of the preferred embodiments of the present invention, prior art semiconductor memories will be described first with reference to the accompanying drawings relating thereto for a clearer understanding of the differences between the prior art and the present invention.

Figure 1:
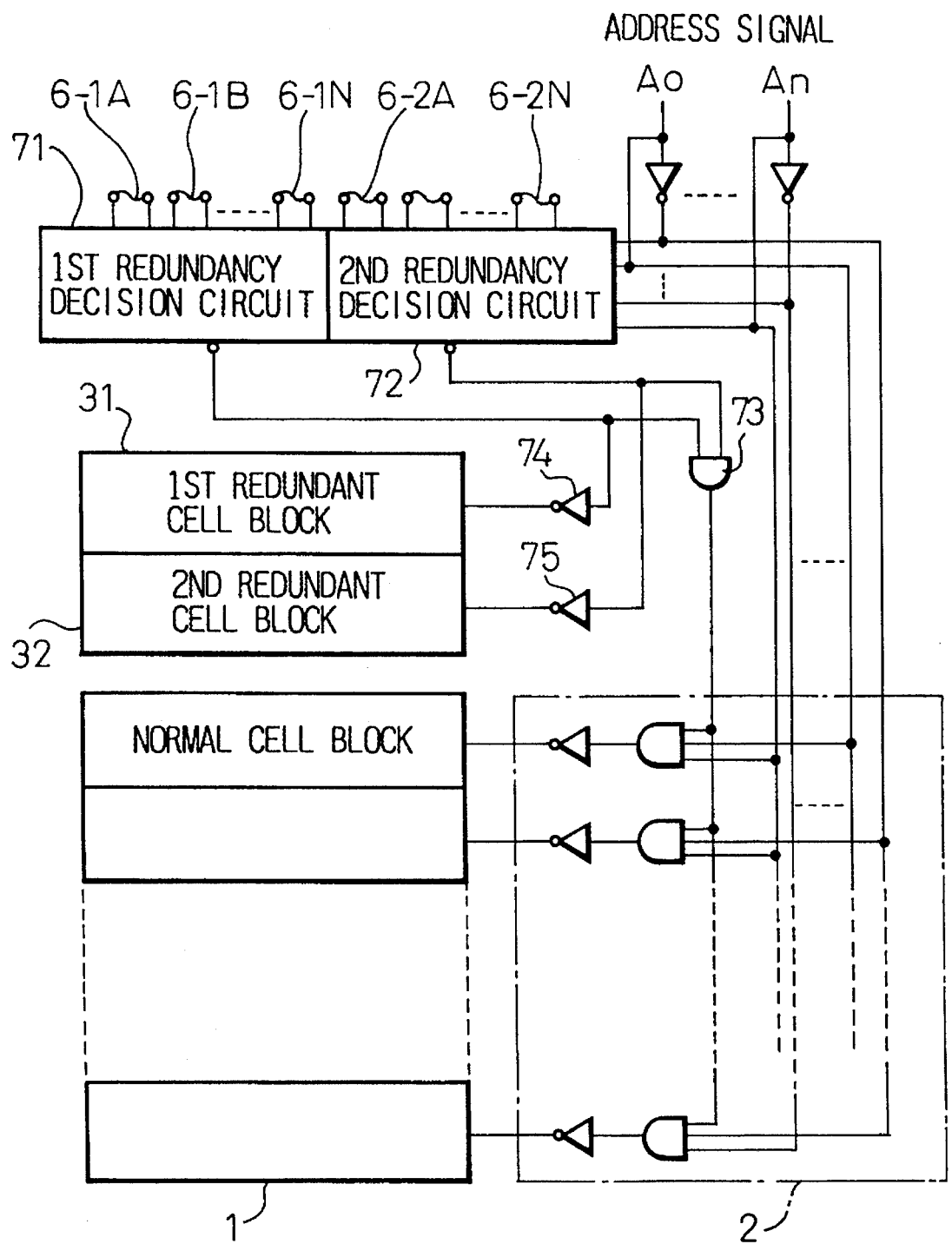
FIG. 1 is a diagram showing a prior art configuration using fuse ROMs in a redundancy circuit.

FIG. 1 is a diagram showing an example of a redundancy circuit using fuses which can be blown by laser. Throughout the drawings, the same functional elements are designated by the same reference numerals, and explanation of such elements is not necessarily repeated for every drawing.

In FIG. 1, the reference numeral 1 indicates normal memory cells (normal cells) which are divided into a plurality of blocks. The numeral 2 indicates a decoder for decoding address signals and selecting a specific part of the normal cells 1. The numerals 31 and 32 indicate first and second redundant cell blocks, respectively, which are brought into use to replace normal cells 1, if defective, on a block-by-block basis; in the illustrated example, two blocks of normal cells 1 can be replaced on a block-by-block basis. Normally, replacement is done on complete word lines or bit lines. The numerals 71 and 72 indicate first and second redundancy decision circuits, respectively, which are used to detect whether the selection made is for a replaced block, that is, whether access is made to any of the redundant addresses stored as fuses, 6-1A, 6-1B, . . . , to substitute the first redundant cell block 31 or the second redundant cell block 32; if the access is for a substitute address, the first redundant cell block 31 or the second redundant cell block 32 is selected through an inverter 74 or 75, and at the same time, a signal is issued through an AND gate 73 to an inverter 2 to inhibit the selection of the normal cells 1.

Figure 2:
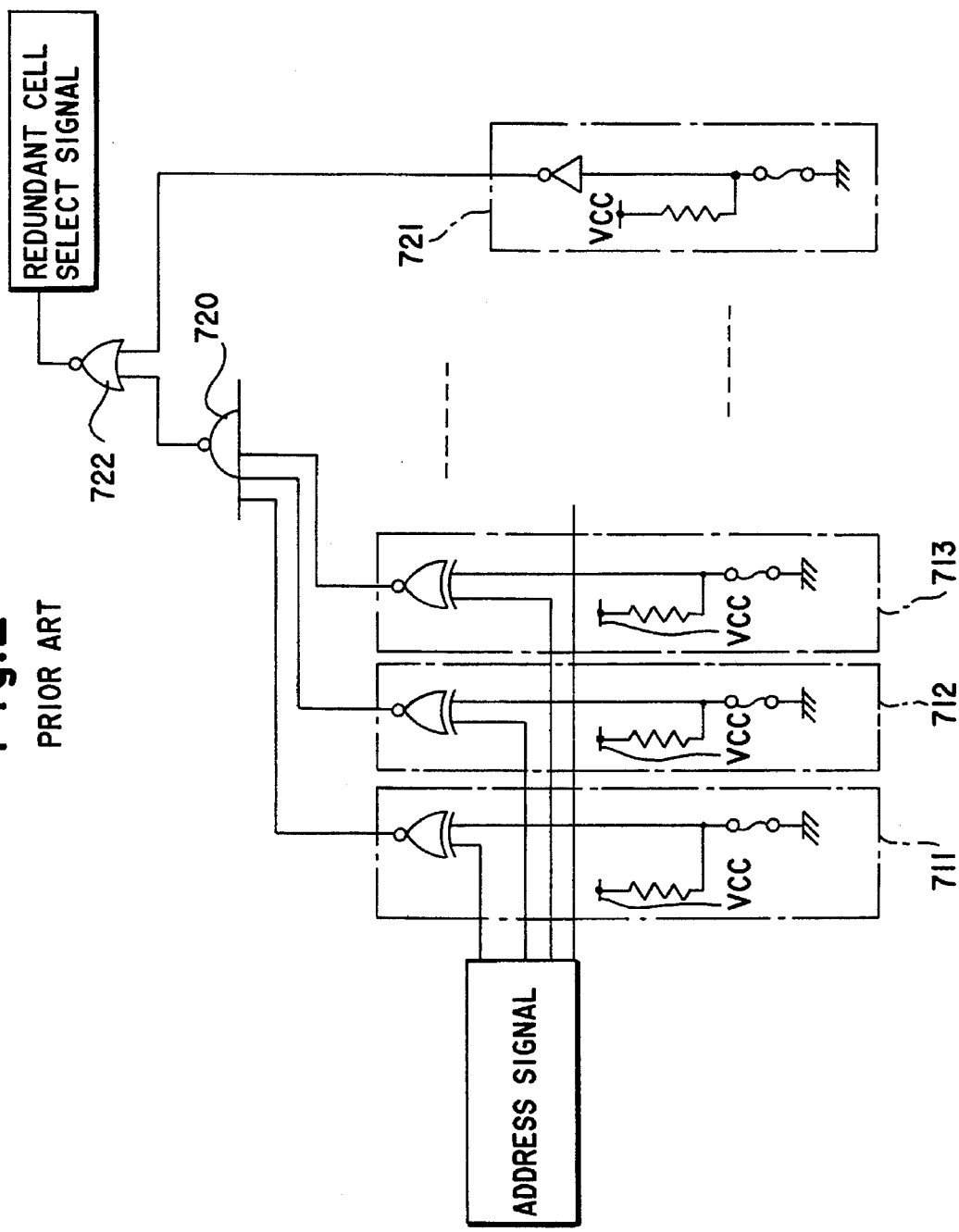
FIG. 2 is a diagram showing the basic configuration of a prior art redundancy decision circuit.

FIG. 2 is a diagram showing the basic configuration of the redundancy decision circuit according to the prior art.

The redundancy decision circuit is required to detect an access made to a particular redundant address; as shown, match detection circuits, 711, 712, 713, . . . , are provided which are equal in number to the address signal bits, and a multiple-input AND gate 720 is used to detect whether the input address matches the substitute address on a bit-by-bit basis. The match detection circuits are usually constructed with exclusive NOR gates; one of the address bits is applied to one input of each gate and the redundant address value set by the fuse is applied to the other input. On the other hand, when there are no defective normal cells and the redundancy function is not switched on, it is necessary not to select the redundant cell even if the input address matches the redundant address. To achieve this purpose, a redundancy memory section 721 is provided which stores information as to whether the redundancy has been switched on. The numeral 722 is a NOR gate which combines the output of the AND gate 720 with a signal supplied from the redundancy memory section 721, and which outputs a redundant-cell select signal if the redundancy is in the switched on state and if the address signal matches. This redundant-cell select signal enables the selection of a redundant cell while disabling normal-cell selection.

The redundancy decision circuit constructed with fuses, as shown in FIG. 1, has the advantage that the area that the redundancy decision circuit takes up is small, but the disadvantage is that the fabrication process for this circuit involves a cumbersome procedure requiring removal of the wafer from die sorting equipment used to hold the wafer in place, blowing the fuses using a laser cutting device, and then retesting the completed circuit. This presents a problem in that silicon particles generated by the laser cutting device may adversely affect other circuit elements.

Figure 3:
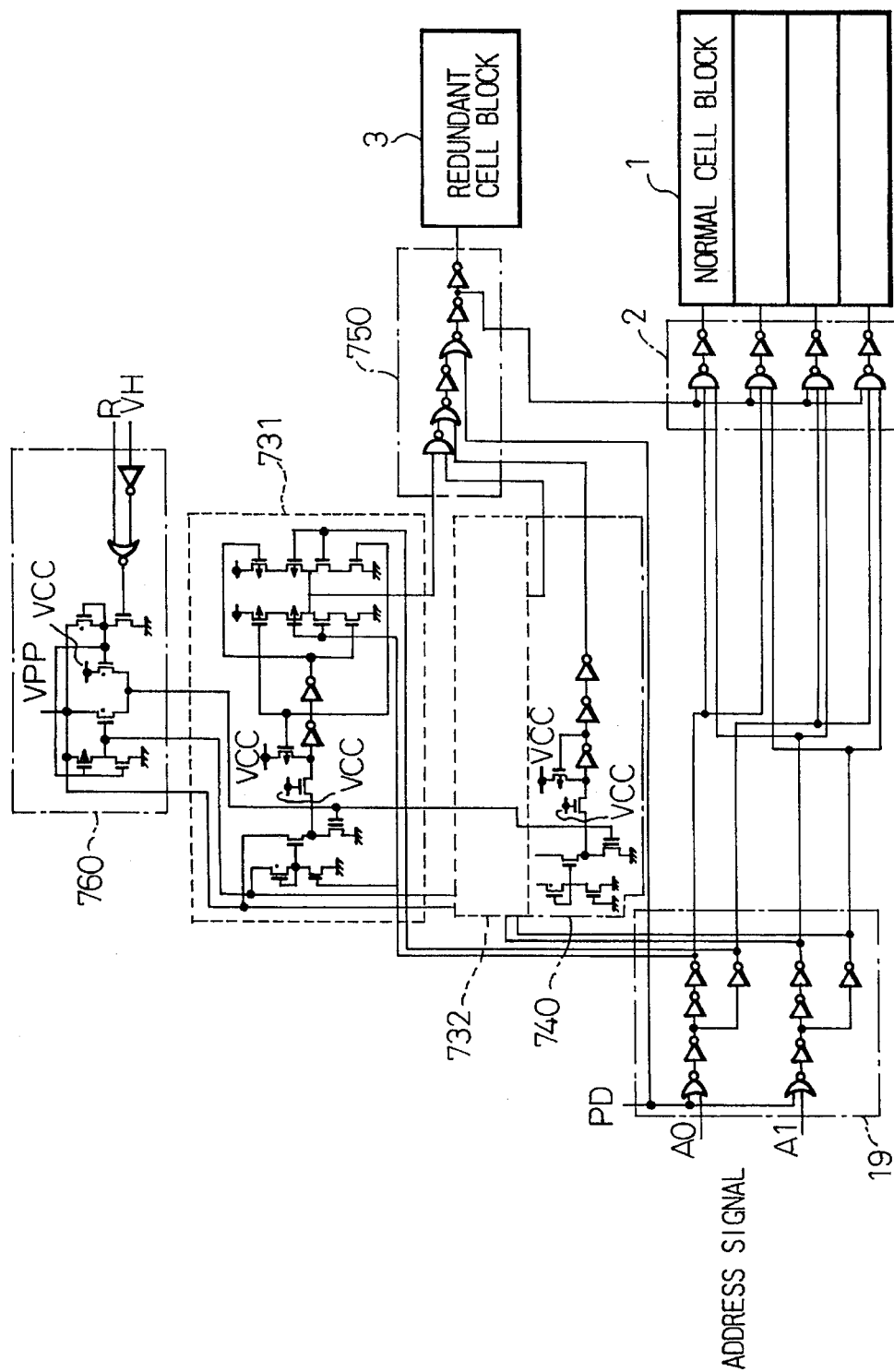
FIG. 3 is a diagram showing a prior art configuration using EPROMs in a redundancy circuit.

FIG. 3 shows an example of a prior art redundancy circuit designed to avoid the above problem by using EPROMs, instead of fuses, for storing a redundant address. For simplicity, it is assumed here that the address signal consists of two bits. In FIG. 3, the numeral 19 indicates an address buffer. The numerals 731 and 732 are match detection circuits corresponding to the circuits shown in FIG. 2; as shown, EPROMs are used instead of fuses. The numeral 740 designates a redundancy memory section for storing information as to whether the redundancy function has been switched on, i.e. whether the EPROMs have been used to switch in the redundancy function. The numeral 750 denotes a redundancy decoder which consists of the same AND gate 720 and NOR gate 722 as used in the configuration of FIG. 2, a NOR gate for outputting a power down signal PD for power conservation, and inverters attached thereto. The numeral 760 indicates a power supply circuit for supplying the voltage applied to the control gates of the EPROMs used in the illustrated circuit configuration. When writing to the EPROMs, the power supply circuit 760 switches its supply voltage to a higher-than-normal voltage for application to the EPROM gates.

The gate circuit 731 shown in FIG. 3 consists of an exclusive NOR circuit in the right side and an EPROM in the left side. Thus, the gate circuit for detecting an address signal match on a bit-by-bit basis is a relatively large circuit. The above configuration requires the same number of such circuits as the number of address bits.

The semiconductor memory of the present invention will now be described below.

First, the basic functional configuration of a first embodiment of the invention will be described with reference to FIG. 4.

Figure 4:
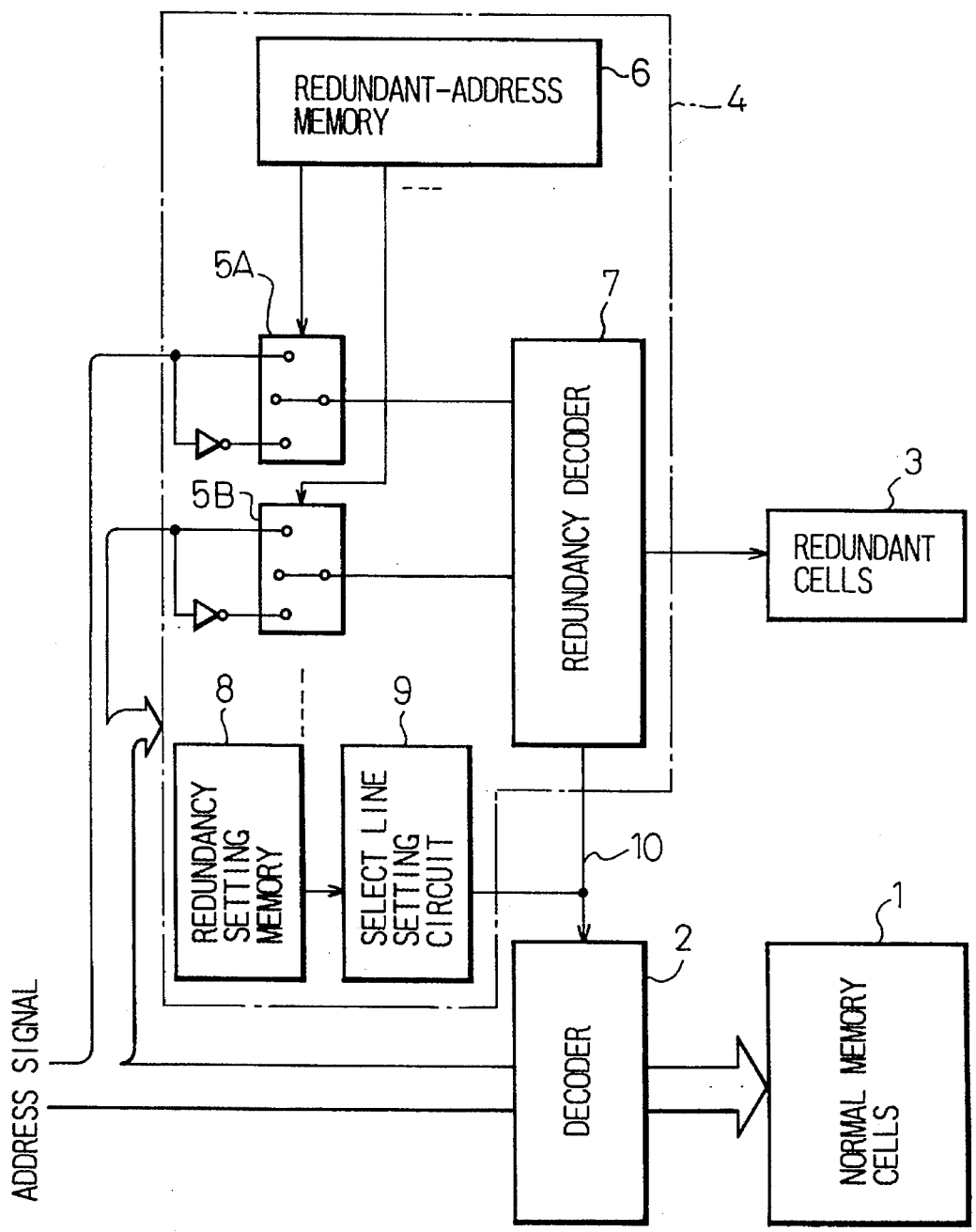
FIG. 4 is a diagram for explaining the basic functional configuration of a first mode of the present invention.

In FIG. 4, the reference numeral 1 is a matrix array of normal memory cells; 2 is a decoder for selecting a specific normal memory cell 1 in accordance with an address signal input; 3 designates redundant cells used to replace some of the normal memory cells 1; and 4 indicates a redundancy decision circuit which detects whether the address signal is a signal that selects those cells replaced by the redundant cells 3, and which, if the signal is for the replaced part, disables the selection by the decoder 2 and enables selection of the redundant cells 3. The redundancy decision circuit 4 comprises: gate circuits, 5A, 5B, . . . , which can be set either to such a state as to enable one of two complementary input signals for output, or to a high impedance state; a redundant-address memory 6, constructed from a nonvolatile semiconductor memory, which outputs a signal for setting the states of the gate circuits 5A, 5B, . . . ; a redundancy decoder 7 which, when the outputs of the gate circuits are set in a prescribed state, outputs a signal to select the redundant cells 3 while, at the same time, outputting onto a redundancy select signal line to the decoder 2 a select-inhibit signal to inhibit the selection of all the parts of the normal memory cells 1; a redundancy setting memory 8 for storing information as to whether the redundancy function is switched on; and a select line setting circuit 9 which outputs a signal onto the redundancy select signal line not to inhibit the selection when the redundancy function is not switched on, and which is put in a high impedance state with respect to the redundancy select signal line when the redundancy function is switched on.

The gate circuits, 5A, 5B, . . . , are the gates that can be set either to such a state as to enable one of two complementary input signals for output, or to a high impedance state; the gates are put in a high impedance state when the redundancy function is not switched on. This in turn puts the output of the redundancy decoder 7 in an undecided state, and the level of the redundancy select signal line 10 is set by the select line setting circuit 9 so that the redundant cells 3 will not be selected. When the redundancy function is switched on, the setting is made so as to enable one of the two complementary input signals for output in accordance with the redundant address; therefore, when a redundant address is input, the output of the redundancy decoder 7 is set to the level to select the redundant cells 3 and inhibit the selection of the normal memory cells 1. When an address other than the redundant address is input, the output is not set to the level to select the redundant cells 3, nor is output the signal to inhibit the selection of the normal memory cells 1, so that the decoder 2 outputs a signal to select the normal memory cells 1.

As described, according to the first mode of the invention, since exclusive NOR circuits are not used for the construction of the match detection circuit for identifying the redundant address, the configuration allows a reduction in the redundant circuit size as well as a reduction in the number of gates through which the address signal input to the redundancy decision circuit passes before accessing the redundant memory. This serves to improve the access speed.

Figure 5:
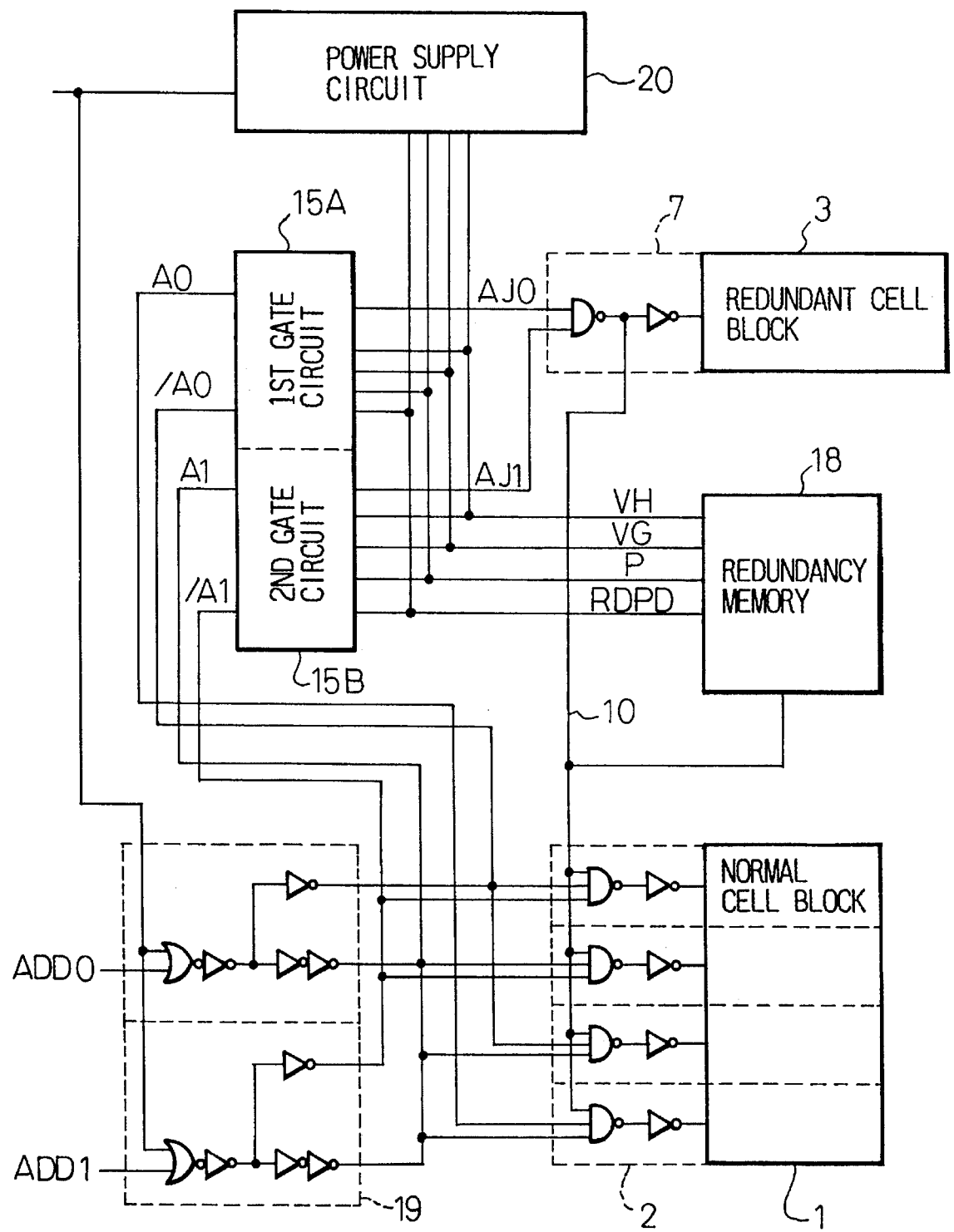
FIG. 5 is a diagram showing the configuration of a first embodiment of the invention.

FIG. 5 is a diagram showing the circuit configuration of a semiconductor memory according to a first embodiment of the invention.

In the figure, the reference numeral 1 indicates normal memory cells arranged into rows each constituting one cell block. The numeral 2 designates a row decoder which, in accordance with an address signal and its complement signal transferred through an address buffer 19, selects a word line to be accessed and applies a voltage to the selected word line. The numeral 3 is a redundant cell block which is used to replace a row of normal cells 1 if the row contains a defect. For simplicity, it is assumed here that the normal cell array 1 consists of four rows of memory cells and that the row address signal consists of two bits. The numeral 7 indicates a decoder for the redundant cell block 3. The numeral 10 indicates a redundancy select signal line for inhibiting the selection of the normal cells 1 by the row decoder 2 when the redundant cell block 3 is selected. The numerals 15A and 15B indicate first and second gate circuits, respectively, for determining whether the address signal is for accessing the redundant cell block; one gate circuit is provided for each bit of the address signal. The numeral 18 indicates a redundancy memory section for storing information as to whether the redundancy function has been switched on. The numeral 19 indicates the address buffer, and the numeral 20 indicates a power supply circuit which supplies a write voltage when writing a redundant address to the EPROMs contained in the first and second gate circuits 15A and 15B. ADD0 and ADD1 represent address signals, and A0 and /A0, and A1 and /A1 are complementary address signal pairs internally generated by the address buffer 19. PD denotes a power down signal for reducing the current flowing through the gate circuits for power conservation when the semiconductor memory is in a deselect state.

Figure 6:
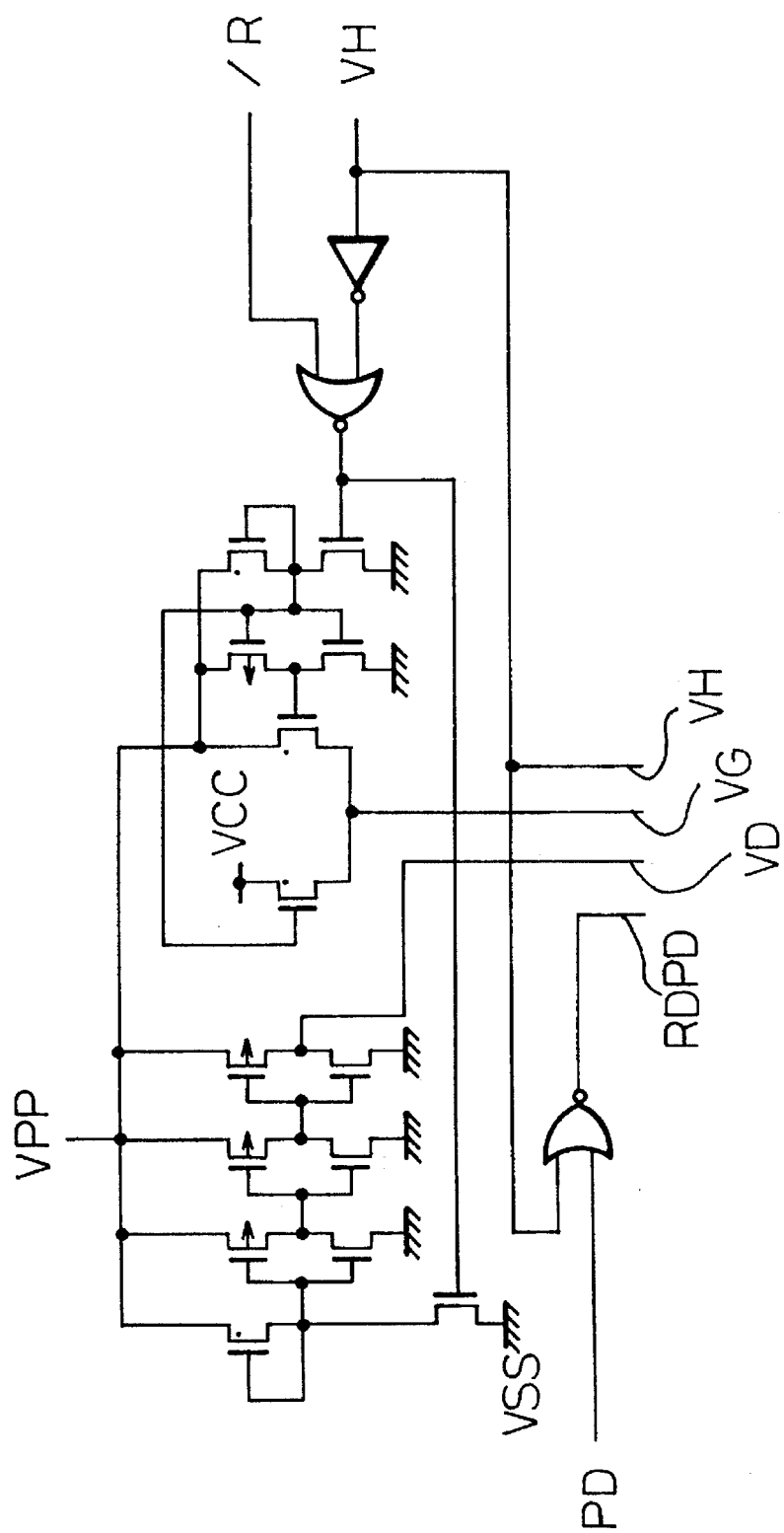
FIG. 6 is a diagram showing the configuration of a write power supply circuit according to the first embodiment.
Figure 7:
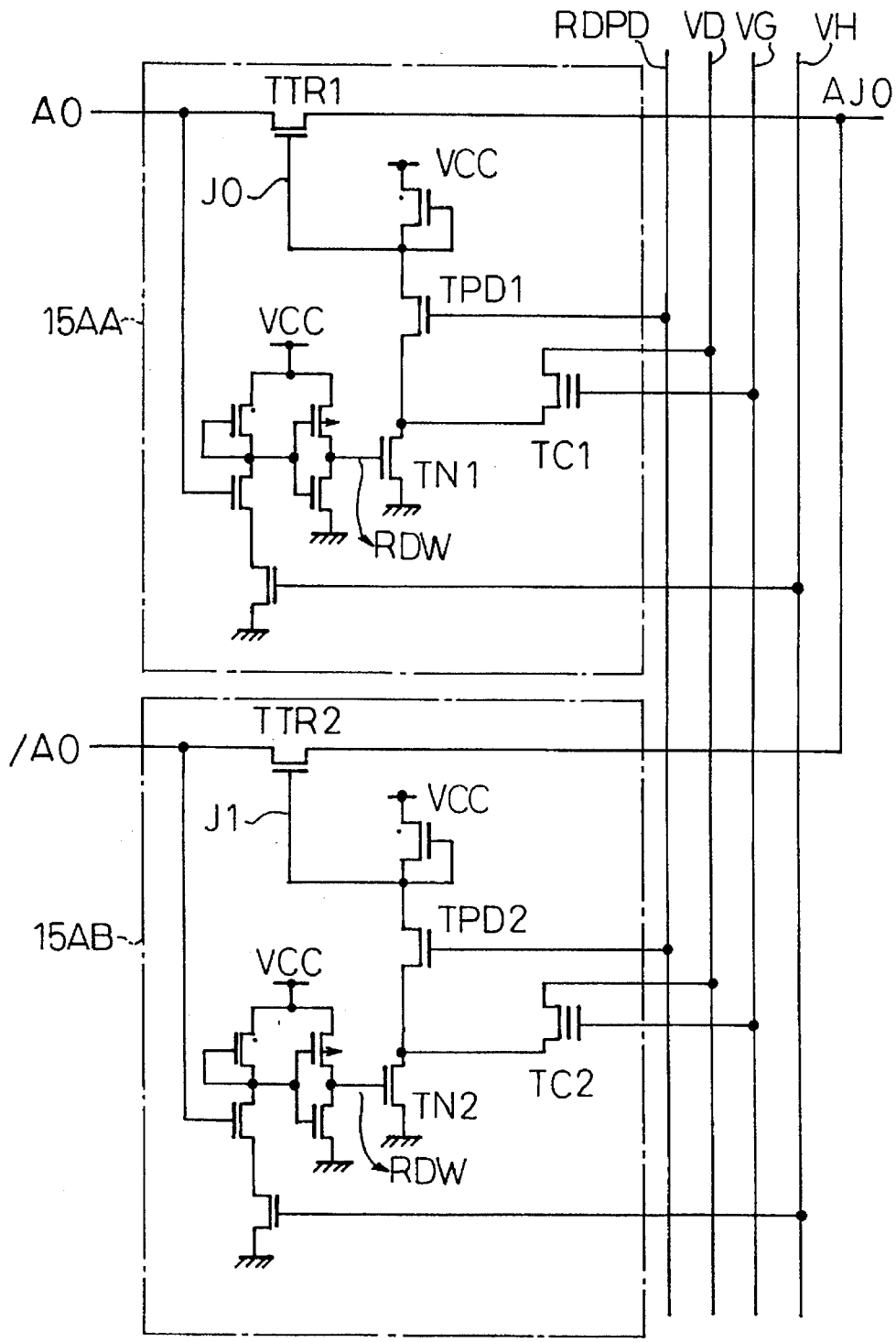
FIG. 7 is a diagram showing the configuration of a gate circuit according to the first embodiment.
Figure 8:
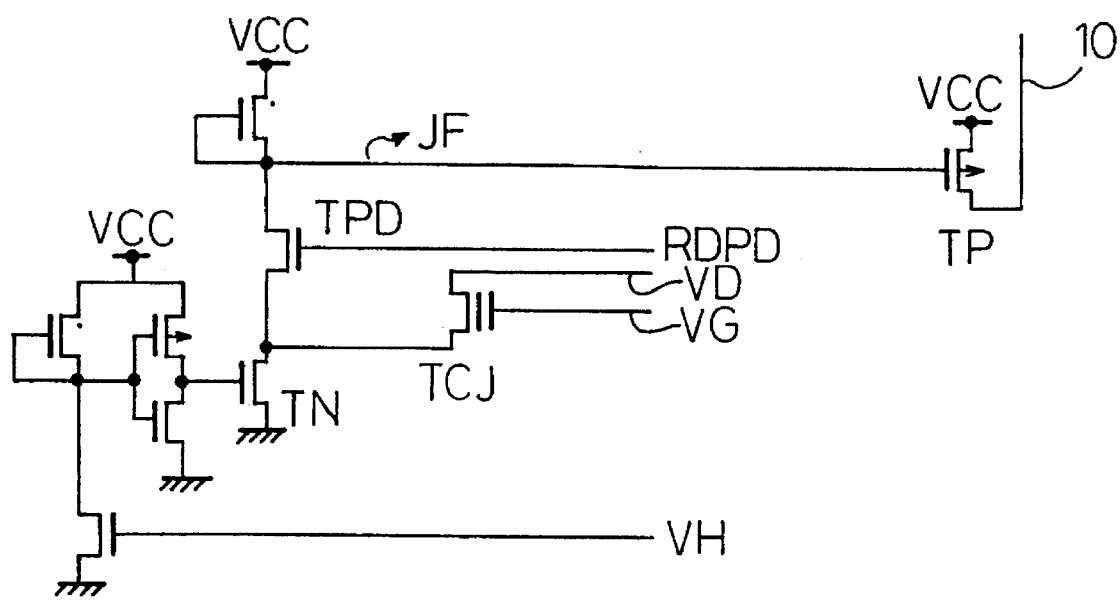
FIG. 8 is a diagram showing the circuit configuration of a redundancy memory section according to the first embodiment.

FIGS. 6 to 8 are diagrams illustrating the details of configurations of the power supply circuit 20, gate circuit 15A, and redundancy memory section 18, respectively, shown in FIG. 5.

The power supply circuit shown in FIG. 6 is a known circuit and does not directly relates to the present invention, and therefore, detailed explanation of this circuit is not given here. As will be described later, the signal VH is set to "H" for writing and to "L" for reading. The signal /R is set to "H" when voltage VPP is applied, and to "L" when voltage VPP is not applied. Thus, for a write operation, when the voltage VPP is applied, VPP, which is a high voltage, appears at VG and VD shown in the figure; for a read operation, on the other hand, the internal supply voltage VCC is output at the same points.

The diagram of FIG. 7 shows the configuration of the first gate circuit 15A in FIG. 5; the second gate circuit 15B has the same configuration. As is apparent from the diagram, the first gate circuit 15A consists of two identical circuits 15AA and 15AB, the only difference being that the internal address signal A0 is input to one circuit and /A0 is input to the other. TTR1 is a transfer gate, and TC1 is an EPROM. The internal address signal A0 is applied to the transfer gate TTR1, while its complement /A0 is applied to the transfer gate TTR2. The outputs of both transfer gates are connected together to produce an output AJ0 for the redundancy decoder 7.

The redundancy memory section shown in FIG. 8 is essentially the same in configuration as the above circuit, except that the transfer gate TTR is replaced by a transistor TP and that no internal address signals are input. The internal power supply of 5V is connected to the transistor TP whose output is coupled to the redundancy select signal line 10.

The circuit operation of the first embodiment will be described below with reference to FIGS. 5 to 8.

Description is first given of a read operation for reading data from the semiconductor memory when the redundancy function is not switched on. At this time, VH is at "L", /R is at "L" when VPP is not applied and at "H" when VPP is applied, and PD is at "L" when the chip is selected and at "H" when the chip is not selected. Here, let us consider the situation where the chip is selected and VPP is not applied.

At this time, TC1, TPD1, TC2, and TPD2 in the first gate circuit 15A are ON, while the transfer gates TTR1 and TTR2 are in the cutoff state as a signal "L" is applied to their gates. Their outputs are therefore put in a high impedance state independently of the levels of the internal address signals ADD0 and ADD1, so that the signal AJ0 is in an undecided state. The situation is the same for the second gate circuit 15B. On the other hand, in the redundancy memory section 18, TCJ and TPD are ON, and the signal JF is put in the "L" state; therefore, the transistor TP is ON, which forces the redundancy select signal line to the "H" state. Though the output of the redundancy decoder 7 to the redundancy select signal line is in an undecided state, since the redundancy select signal line 10 is put in the "H" state by the action of the transistor TP, the redundancy cell block 3 is always placed in the deselected state, and one of the normal cell blocks 1 is selected in accordance with the address signal.

When the chip is deselected, PD is set to "H". This prevents current from flowing through the gate circuits.

For storing a redundant address, VPP is applied, and VH is set to "H". At this time, the signals VG and VD shown in the figures are raised to the voltage VPP, while RDPD is set to "L". Under these conditions, in the first gate circuit 15A, RDW shown in the figure is set to "L" or "H" according to the internal address signals A0 and /A0, and writing to TC1, TC2, etc. is performed in accordance with the state of RDW. Since A0 and /A0 are complementary signals, TC1 and TC2 are always set to opposite states. If the address signal ADD0 is "H", writing is performed to TC1 in the first gate circuit 15A, but writing is not performed to TC2. The situation is the same for the second gate circuit 15B. At the same time, writing is also performed to TCJ in the redundancy memory section 18.

We will now describe how reading is performed after the redundant address has been stored. For reading, /R is set to "H", VH is set to "L", and PD is set to "L".

In the circuit 15AA of the first gate circuit 15A, since TC1 is in a written state, TPD1 is ON, but since TC1 and TN1 are both OFF, the gate electrode of TTR1 is "H"; hence, TTR1 is ON. At this time, in the circuit 15AB, since TC2 is not in a written state, TTR2 is OFF. Therefore, of the two internal address signals, the signal A0 is output as AJ0. The situation is the same for the second gate circuit 15B; if the writing was done with A1 at "H", the signal A1 appears at AJ1. Similarly, in the redundancy memory section 18, since the signal JF is set to "H", TP is put in the cutoff state. As a result, the signal A0 and A1 are input to the redundancy decoder 7; in this case, when the address signals ADD0 and ADD1 are both "H", the output of the NAND gate in the redundancy decoder 7 becomes "L" to select the redundant cells 3. This combination of the address signals is for selecting the fourth normal cell block in the figure, but since the redundancy select signal line 10 is set to "L", selection of the normal cell block 1 by the decoder 2 is inhibited. In other combinations of the address signals, the output of the NAND gate in the redundancy decoder 7 becomes "H", which disables the selection of the redundant cells 3 while enabling the selection of the normal cell block 1.

As is apparent from the above description, according to the circuit of the first embodiment, once the redundant address has been stored at the test stage, the semiconductor memory is always in a redundancy-effected state, so that the input address signal is just passed through the transfer gate before being input to the redundancy decoder. This arrangement prevents degradation of the access speed when the redundant cell block is selected. Furthermore, as is apparent from the comparison with the circuit of FIG. 12, the redundant-address detection circuit of this embodiment is simple in construction since no exclusive NOR circuits are used.

Figure 9:
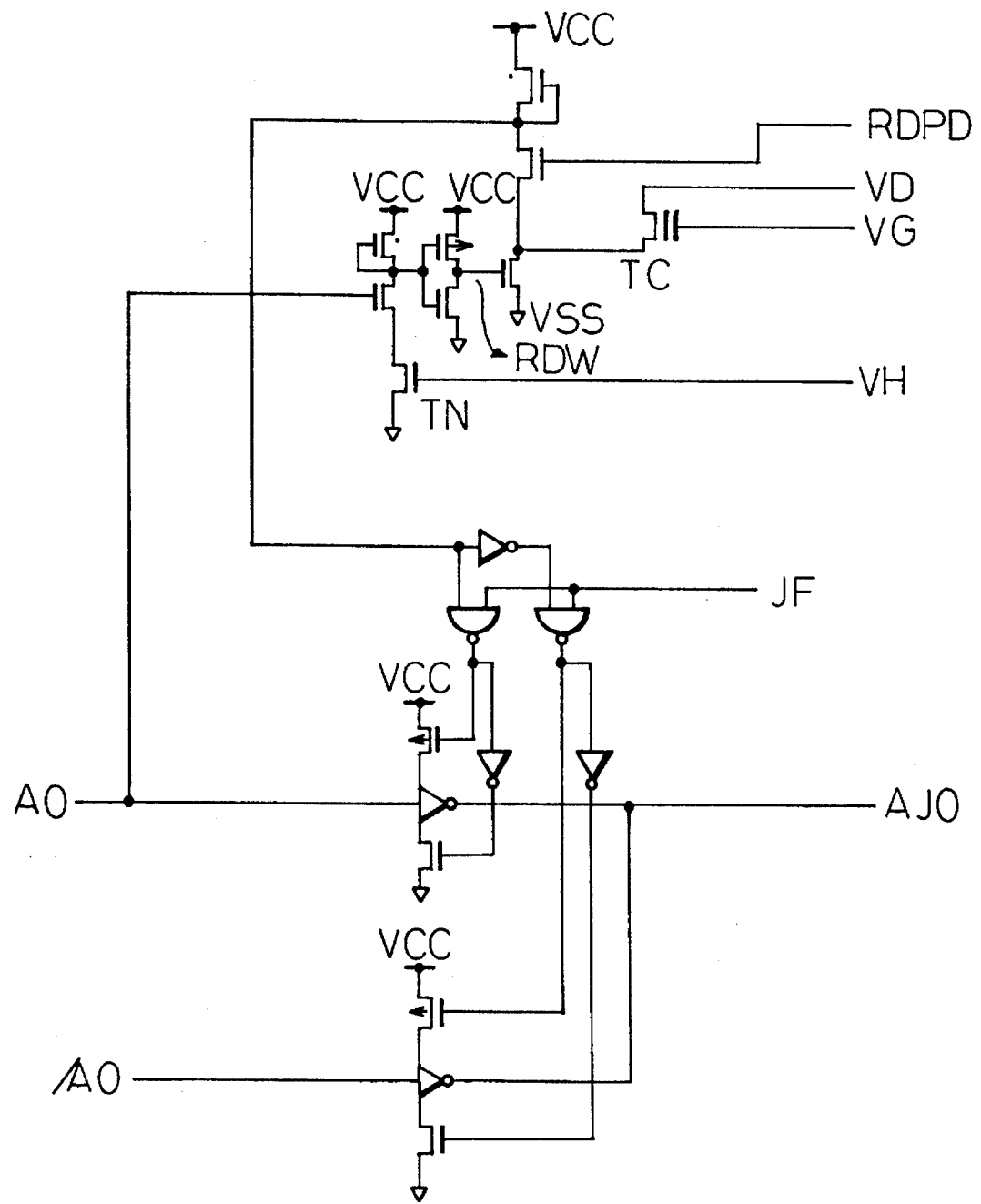
FIG. 9 is a diagram showing the configuration of a gate circuit according to a second embodiment of the invention.

The configuration of the first embodiment uses transfer gates in the redundant-address detection circuit, but instead of transfer gates, three-state buffers capable of assuming three states can be used to implement the detection circuit. The second embodiment hereinafter described is concerned with this alternative implementation of the gate circuit, which is shown in FIG. 9. The configuration of the second embodiment is identical to that of the first embodiment, the only difference being in the gate circuit.

In contrast to the circuit of FIG. 7, the circuit of FIG. 9 is configured so that the three-state buffers are controlled by the signals that are used to control the gate electrodes of the transfer gates in the circuit of FIG. 7. The circuit of FIG. 9 uses one EPROM, and the signal obtained from the data stored in the above-described manner is inverted to control the other three-state buffer. With this configuration, however, since one or other of the three-state buffers is always conducting, a signal is output to the redundancy decoder 7 even when the redundancy is not switched on. In the second embodiment, therefore, the signal JF from the redundancy memory circuit 18 is used to put both three-state buffers in the nonconducting state when the redundancy function is not switched on.

Figure 10:
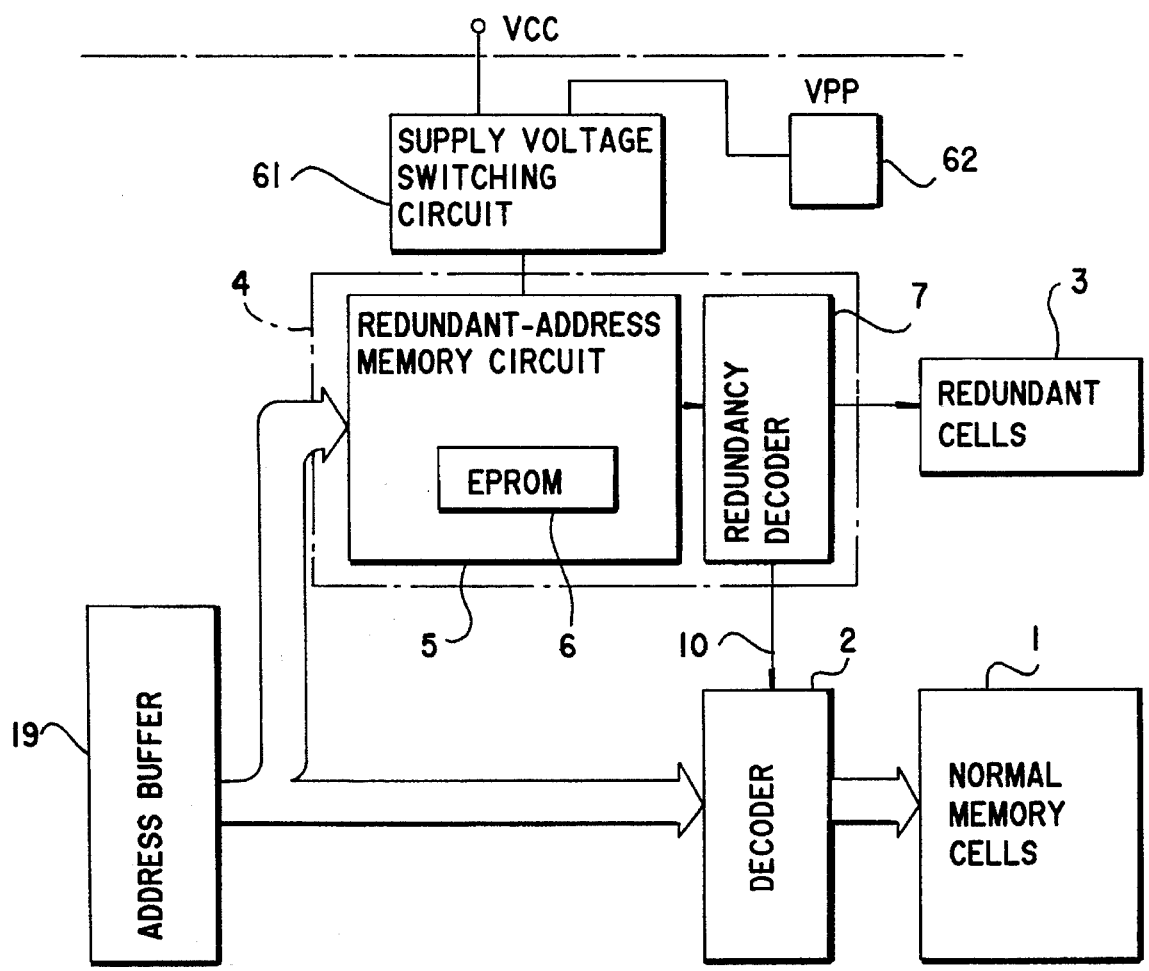
FIG. 10 is a diagram showing the configuration of a third embodiment of the invention.

FIG. 10 is a diagram showing the configuration of a semiconductor memory according to a third embodiment. The semiconductor memory of this embodiment is designed, when assembled into a final product, to operate only with an external voltage source of 5V. As shown, the semiconductor memory comprises a normal memory cell array 1, a decoder 2 for selecting a specific memory cell in the normal memory cell array 1 in accordance with an address signal input from an address buffer 19, and a redundant cell block 3 used to replace part of the normal memory cell array 1 if that part contains a defect. Further, the numeral 5 is a redundant-address memory circuit which stores the address of the part replaced by the redundant cell block 3 and which determines whether the input address signal coincides with the stored signal. This circuit contains an EPROM 6 for storing a redundant address. The redundant-address memory circuit 5 has the configuration shown, for example, in FIG. 7, but it is not restricted to the configuration of FIG. 7; for example, the prior art circuit using EPROMs, as shown in FIG. 3, may be used alternatively. The numeral 7 is a redundancy decoder which selects the redundant cell block 3 and, at the same time, outputs a signal to the decoder 2 to inhibit the selection of the normal memory cell array 1, when the redundant-address memory circuit 5 has detected that the address signal is for the replaced cells. The numeral 61 is a supply voltage switching circuit which will be described later, and 62 is an electrode pad for supplying a high voltage.

The memory used in the redundant-address memory circuit 5 for storing the redundant address is constructed from an electrically programmable nonvolatile semiconductor memory such as an EPROM, EEPROM, or flash memory. Such a nonvolatile memory requires a high voltage when writing data into selected memory cells. However, the above semiconductor memory is designed to operate with a single voltage source of 5V, and therefore, such a high write voltage is not supplied in normal operation. If the normal memory cells 1 are DRAM or SRAM cells, not nonvolatile memory cells, the application of a high voltage is not required when accessing the normal memory cells 1. Therefore, the high voltage for writing the redundant address to the redundant-address memory circuit 5 needs to be supplied externally. In this embodiment, therefore, the electrode pad 62 is not connected externally in a completed circuit, and the supply voltage switching circuit 61 switches to the high voltage side to supply the required high voltage through the electrode pad 62 only when writing the redundant address.

Figure 11:
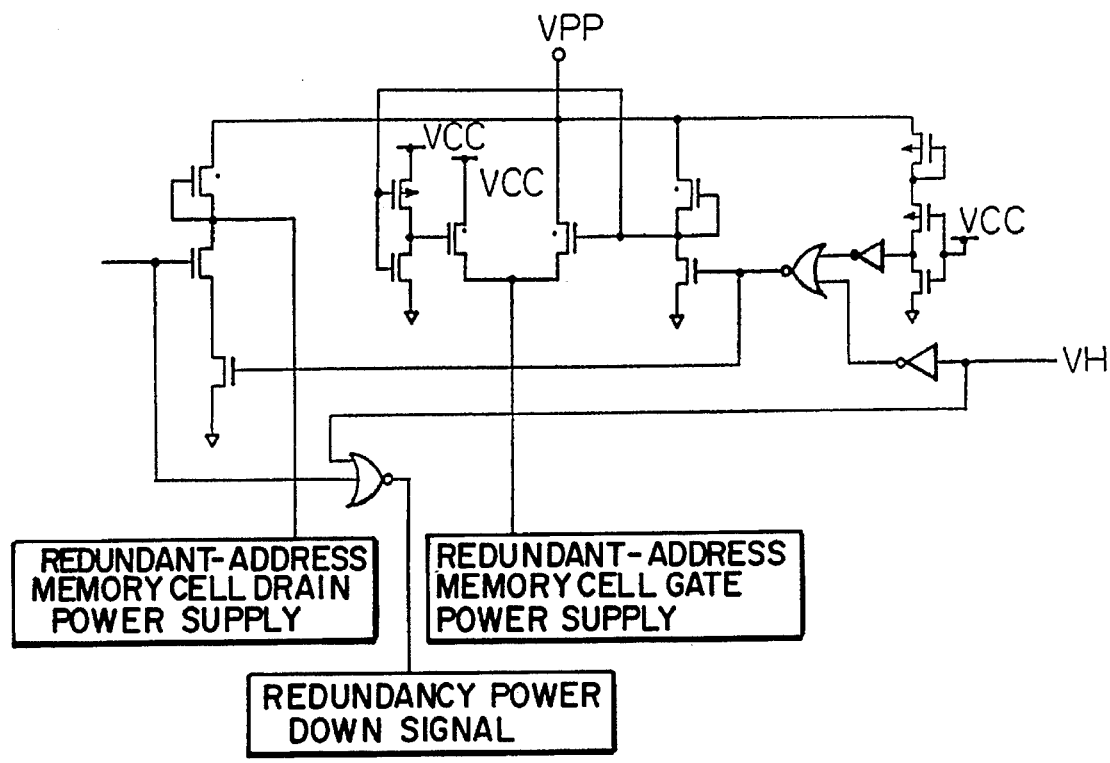
FIG. 11 is a diagram showing the configuration of a supply voltage switching circuit according to the third embodiment.

FIG. 11 is a diagram illustrating the supply voltage switching circuit of this embodiment.

In the circuit of FIG. 11, the application of VPP causes a NOR gate to output an "L", and a redundant-address memory cell gate voltage supply and a redundant-address memory cell drain voltage supply both rise to the voltage VPP. When VPP is not applied, the output of the NOR gate is "H", and the redundant-address memory cell gate voltage supply and the redundant-address memory cell drain voltage supply are both set to the voltage VCC. Thus, the supply voltage for output switches automatically according to whether VPP is applied or not.

If the normal memory cells 1 in the semiconductor memory of FIG. 10 are nonvolatile memory cells such as EPROM, EEPROM, or flash memory, the write operation is also performed to the normal memory cells. Such a memory, therefore, contains a booster circuit for writing, etc. even if the memory is designed to operate with a single voltage source of 5V. In such a case, it may be possible to use the high voltage output of the booster circuit to write a redundant address into the redundant-address memory circuit 5. However, as previously noted, since the booster circuit takes up chip area, it is not possible to provide a large booster circuit when chip area conservation is considered. It is therefore usual to design the booster circuit to have the capacity just enough to meet the minimum requirement for writing data into the normal memory cells. In normal data write operation, writing is usually performed in units of 8 bits at the maximum, so that the booster circuit is usually designed to have the just enough capacity for writing of eight bits. On the other hand, the storage capacity of nonvolatile semiconductor memories has been increasing in recent years, and many memories are constructed with rows and columns each having a bit count exceeding eight bits. Such memories present a problem in that the booster circuit for usual data writing cannot be used to write a redundant address. This problem can be solved by externally supplying the high voltage necessary for the writing, as described above. Thus, the configuration of the third embodiment is also effective for nonvolatile semiconductor memories having an internal booster circuit.

When the redundancy memory circuit uses a nonvolatile semiconductor memory for storing a redundant address, it is important from the viewpoint of manufacturing process that the redundancy memory circuit be formed simultaneously with the normal memory cells, etc. Therefore, if the normal memory cells are DRAM or SRAM cells, for example, the nonvolatile semiconductor memory used in the redundancy memory circuit will have to be formed in a different processing step. For this reason, it is difficult to apply the configuration of the third embodiment to semiconductor memories other than nonvolatile memories such as EPROM, EEPROM, flash memory, etc. Therefore, it is desirable that the configuration of this embodiment be applied to a nonvolatile semiconductor memory.

Figure 12:
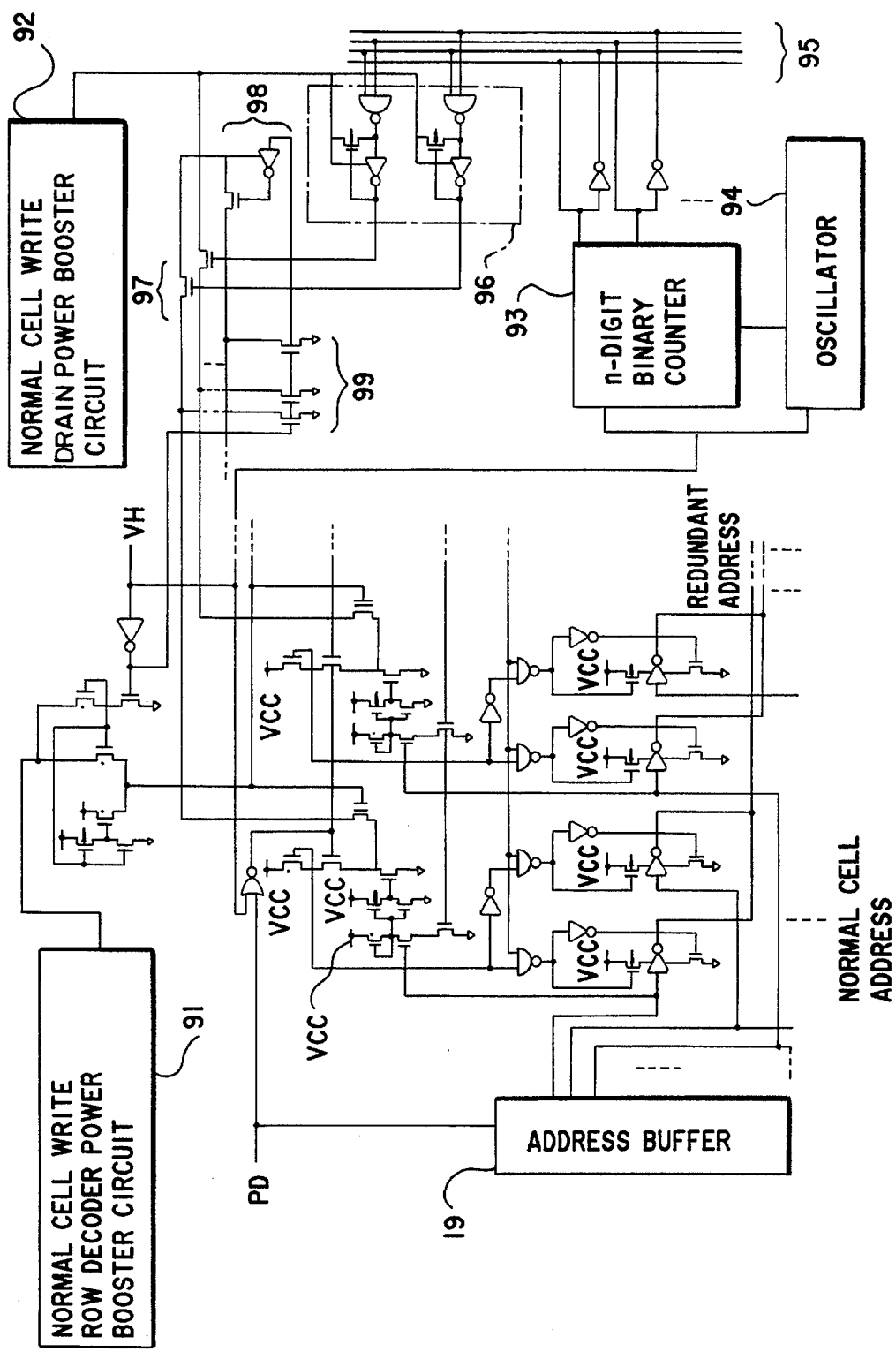
FIG. 12 is a diagram showing the configuration of a fourth embodiment of the invention.

In the fourth embodiment hereinafter described, writing of a redundant address into a nonvolatile semiconductor memory is performed by time division to reduce the capacity of the high-voltage power supply used for redundant-address writing. FIG. 12 is a diagram showing the configuration of the semiconductor memory of the fourth embodiment.

In FIG. 12, are shown the same gate circuits as previously shown in FIG. 6, and disposed above them is a redundancy supply voltage switching circuit. The number of gate circuits provided is equal to n bits, and one bit is written in each EPROM. The above circuits are identical to those previously described. The following description focuses on the differences between this embodiment and the previous ones. The memory of this embodiment is constructed from a nonvolatile memory, and includes a row decoder power booster circuit 91 for normal memory cell writing and a drain power booster circuit 92 for normal memory cell writing. These booster circuits are also used for writing a redundant address into the redundant-address memory circuit. The numeral 93 is an n-digit binary counter, and 94 is an oscillator for supplying a clock signal to the n-digit binary counter 93. The numeral 95 is a counter bus on which count values from the n-digit binary counter 93 are output. The numeral 96 is a decoder for decoding the count values fed via the counter bus 95 and thereby selecting a bit to be written in the redundant-address memory circuit. The numeral 97 is a switch circuit for connecting the selected bit in the redundant-address memory circuit to the normal cell write drain voltage booster circuit 92 in accordance with the output of the decoder 96; the drain of the EPROM for the selected bit is thus connected to the normal cell write drain voltage booster circuit 92. The numeral 98 indicates a circuit which is switched to connect and disconnect the EPROMs in the redundancy memory circuit to the normal cell write drain voltage booster circuit 92. The numeral 99 is a circuit which functions to ground the drains of the EPROMs in the redundancy memory circuit during operations other than redundant address writing.

To write a redundant address in the circuit of FIG. 12, the normal cell write row decoder power booster circuit 91 and the normal cell write drain power booster circuit 92 are turned on, the signal HV is set to "H", and the address signal for replacing is input. The redundant address is thus written to the EPROMs in the redundancy memory circuit. When the oscillator 94 is turned on, the n-digit binary counter 93 starts counting, and count values are output on the counter bus 95. In accordance with the count values, the decoder 96 selects the switches 97 in turn to write each bit to the corresponding EPROM in the redundancy memory circuit. The redundant address is thus written by time division. This allows the use of a booster circuit with a small capacity for writing a multibit redundant address.

The examples described above use EPROMs or EEPROMs, not fuse ROMs, for storing a redundant address. It will be noted, however, that fuse ROMs can also be used in the configuration of the redundancy decision circuit designed to minimize signal propagation delay due to redundant address evaluation processing; as previously described, this configuration comprises the gate circuits, 5A, 5B, . . . , which can be set either to such a state as to enable one or other of the complementary input signals for output, or to a high impedance state, and the select line setting circuit 9 for controlling the redundancy select signal line.

Figure 13:
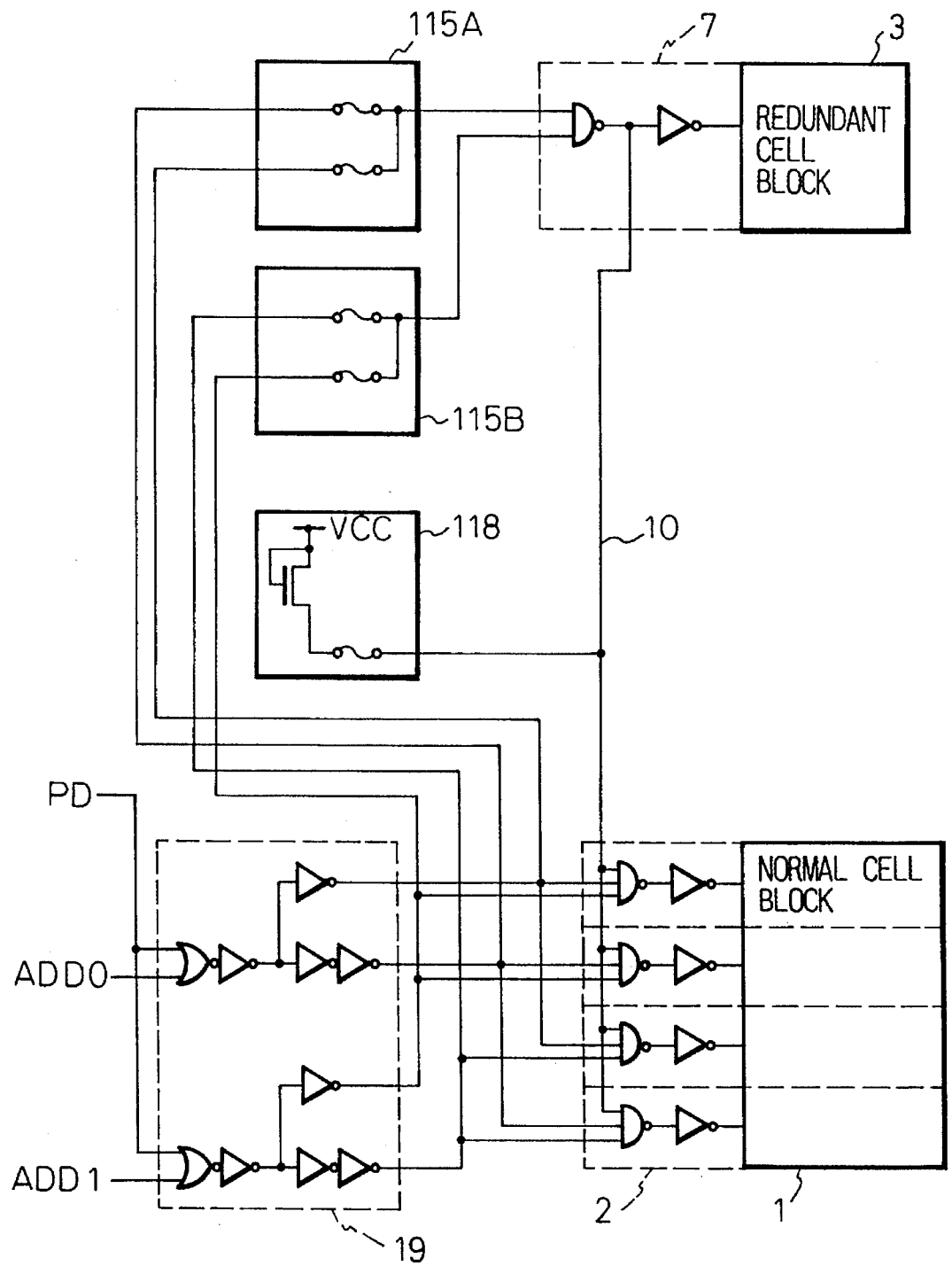
FIG. 13 is a diagram showing the circuit configuration of a fifth embodiment of the invention.

FIG. 13 is a diagram showing the configuration of a fifth embodiment that uses the above circuit configuration for setting a redundant address, and yet is designed to prevent degradation of the access speed. In the circuit shown in FIG. 13, the first gate circuit 15A, second gate circuit 15B, and redundancy memory section in the circuit configuration of the first embodiment shown in FIG. 5 are replaced by a first fuse gate circuit 115A, a second fuse gate circuit 115B, and a fuse redundancy memory circuit 118, respectively. The EPROM writing power supply circuit 20 is omitted as it is not necessary.

The fuse gate circuits are each constructed with two fuses to which the complementary signals of each address bit signal are input. The other ends of the fuses are connected together and coupled to the redundancy decoder 7. The fuse redundancy memory circuit 118 includes a fuse connected between a positive voltage source and a redundancy select signal line 10. A transistor that acts as a load resistance is also included.

In the circuit of FIG. 13, when there are no defects in the normal memory cell array 1 and the redundancy is not switched on, the four fuses in the fuse gate circuits 115A and 115B are all opened, while the fuse in the fuse redundancy memory circuit 118 is left closed. As a result, the inputs to the redundancy decoder 7 are all put in a high impedance state, and hence the output of the AND circuit is in an undecided state. However, since the redundancy select signal line 10 is set to the "H" state by the fuse redundancy memory circuit 118, access is allowed only to the normal cell block 1.

To put the redundancy function in the switched-on state, the fuse in the fuse redundancy memory circuit 118 is opened, and one or other of the paired fuses in each of the fuse gate circuits 115A and 115B is opened in accordance with the redundant address. As a result, the redundancy select signal line 10 is controlled by the output of the redundancy decoder 7. For example, when the redundant address is selected, the select signal line 10 is set to "L" and selection of the normal memory cells 1 is inhibited; otherwise, the redundancy select signal line 10 is set to "H" to allow the selection of the corresponding normal memory cell block 1.

According to the invention, the semiconductor memory has a redundancy circuit that accomplishes simplified redundancy processing, and provides the access speed comparable to the access speed for reading normal cells, thus enhancing the operating speed. Furthermore, using the configuration of the invention, writing of a redundant address is made possible in a semiconductor memory designed to operate with a low-voltage, single power supply and containing a redundancy circuit constructed with electrically programmable memory devices such as EEPROMs.

I claim:

1. A semiconductor memory comprising:

a matrix array of normal memory cells;

a decoder for selecting some of said memory cells in accordance with an address signal;

redundant cells for replacing some of said memory cells; and a redundancy decision circuit for detecting whether the address signal is a signal that selects a part replaced by said redundant cells, and for disabling selection by said decoder and enabling selection of said redundant cells when the signal is for the replaced part, said redundancy decision circuit including:

gate circuits that can be set either to such a state as to enable one of the complementary input signals for output, or to a high impedance state;

a redundant-address memory, constructed of a nonvolatile semiconductor memory, for outputting a signal that sets the state of said gates;

a redundancy decoder which, when the outputs of said gate circuits are put in a prescribed state, outputs a signal to select said redundant cell and, at the same time, outputs a select-inhibit signal onto a redundancy select signal line to said decoder to inhibit the selection of any of said memory cells;

a redundancy setting memory for storing information regarding whether redundancy is switched on or not; and a select line setting circuit which outputs a signal onto said redundancy select signal line not to inhibit the selection when redundancy is not switched on, and which is put in a high impedance state with respect to said redundancy select signal line when redundancy is switched on.

2. A semiconductor memory according to claim 1, wherein said normal memory cells are electrically programmable nonvolatile semiconductor memory cells.

3. A semiconductor memory according to claim 1, wherein said gate circuits are each constructed with a plurality of circuits having two buffer gates to which normal and complement signals of each bit in the address signal are respectively input, and whose outputs are capable of being put in a high impedance state.

4. A semiconductor memory according to claim 2, wherein said gate circuits are each constructed with a plurality of circuits having two buffer gates to which normal and complement signals of each bit in the address signal are respectively input, and whose outputs are capable of being put in a high impedance state.

5. A semiconductor memory comprising:

a matrix array of normal memory cells;

a decoder for selecting part of said memory cells in accordance with an address signal;

a redundant cell for replacing some of said memory cells; and a redundancy decision circuit for detecting whether the address signal is a signal that selects a part replaced by said redundant cells, and for disabling selection by said decoder and enabling selection of said redundant cells when the signal is for the replaced part, said redundancy decision circuit including an electrically programmable nonvolatile semiconductor redundancy memory for storing the address of the part replaced by said redundant cells, a write voltage for writing the address into said redundancy nonvolatile semiconductor memory being supplied from outside said semiconductor memory.

6. A semiconductor memory according to claim 5, further including a special electrode pad to which the write voltage for writing the address into said redundancy nonvolatile semiconductor memory is applied, and which is not used in a final assembled product.

7. A semiconductor memory comprising a redundant cell for replacing a part of normal memory cells arranged in a matrix array, and an electrically programmable redundancy nonvolatile semiconductor memory for storing the address of the part to be replaced, further comprising means for dividing a redundant address into a plurality of bits, and for writing said plurality of bits into said redundancy nonvolatile semiconductor memory by time division.

8. In a semiconductor memory comprising a redundant cell for replacing a part of normal memory cells arranged in a matrix array, and an electrically programmable redundancy nonvolatile semiconductor memory for storing an address of the part to be replaced, a redundant-address writing method for writing the address of the part to be replaced into said redundancy nonvolatile semiconductor memory, said method comprising the steps of:

dividing the address of the part to be replaced into a plurality of bits; and writing said plurality of bits into the electrically programmable redundancy nonvolatile semiconductor memory by time division.

* * * * *